United States Patent [19]

Godejahn, Jr.

[11] 4,455,737

[45] * Jun. 26, 1984

[54] PROCESS FOR AND STRUCTURE OF HIGH DENSITY VLSI CIRCUITS, HAVING SELF-ALIGNED GATES AND CONTACTS FOR FET DEVICES AND CONDUCTING LINES

[75] Inventor: Gordon C. Godejahn, Jr., Santa Ana, Calif.

[73] Assignee: Rockwell International Corporation, El Segundo, Calif.

[*] Notice: The portion of the term of this patent subsequent to Sep. 9, 1997 has been disclaimed.

[21] Appl. No.: 242,442

[22] Filed: Mar. 11, 1981

Related U.S. Application Data

[62] Division of Ser. No. 909,886, May 26, 1978, Pat. No. 4,277,881.

[51] Int. Cl.³ .................... H01L 21/225; H01L 29/78
[52] U.S. Cl. ..................... 29/571; 29/577 C; 29/578; 148/1.5; 148/187; 156/653; 156/657; 357/41; 357/45; 357/54; 357/59; 357/23.9
[58] Field of Search ............ 29/571, 577 C, 578; 148/187, 1.5; 156/653, 657; 357/41, 45, 54, 59

[56] References Cited

U.S. PATENT DOCUMENTS

| | | | |
|---|---|---|---|
| 3,747,200 | 7/1973 | Rutledge | 29/571 |
| 3,793,090 | 2/1974 | Barile et al. | 148/1.5 |
| 3,841,926 | 10/1974 | Garnache et al. | 148/187 X |
| 4,021,789 | 5/1977 | Furman et al. | 357/54 X |
| 4,110,776 | 8/1978 | Rao et al. | 357/23 |
| 4,139,402 | 2/1979 | Steinmaier et al. | 29/571 X |
| 4,192,059 | 3/1980 | Khan et al. | 29/578 X |
| 4,210,993 | 7/1980 | Sunami | 29/571 |
| 4,221,044 | 9/1980 | Godejahn et al. | 29/571 |
| 4,221,045 | 9/1980 | Godejahn | 29/578 X |

FOREIGN PATENT DOCUMENTS 1408180 10/1973 United Kingdom .
2040564 8/1980 United Kingdom .

OTHER PUBLICATIONS

Tanigaki et al, "New Self-Aligned Contact Technology" J. Electrochem. Soc., vol. 125, No. 3, Mar. 1978, pp. 471-472.

*Primary Examiner*—William G. Saba
*Attorney, Agent, or Firm*—H. Fredrick Hamann; Wilfred G. Caldwell

[57] ABSTRACT

A process for producing VLSI (very large scale integrated) circuits employs techniques of self-aligned gates and contacts for FET devices and for both diffused conducting lines in the substrate and polysilicon conducting lines situated on isolating field oxide formed on the substrate. Mask alignment tolerances are increased and rendered non-critical. The use of materials in successive layers having different etch characteristics permits selective oxidation of desired portions only of the structure without need for masking and removal of selected material from desired locations by batch removal processes again without use of masking. There results VLSI circuits having increased density and reliability.

12 Claims, 38 Drawing Figures

PROCESS FOR AND STRUCTURE OF HIGH DENSITY VLSI CIRCUITS, HAVING SELF-ALIGNED GATES AND CONTACTS FOR FET DEVICES AND CONDUCTING LINES

This is a division of application Ser. No. 909,886 filed May 26, 1978, U.S. Pat. No. 4,277,881. Concurrently filed herewith is a further divisional application Ser. No. 242,441.

BACKGROUND OF THE INVENTION

1. Field of the Invention

This invention relates to the field of semiconductor device fabrication techniques and structures and more particularly to the field of fabricating FET devices and conducting lines for interconnecting such devices thereby to provide VLSI circuits of increased density and reliability.

2. Prior Art

The semiconductor art has been concerned with reducing the size and power consumption of individual devices in integrated circuits in order to increase the logic power of these circuits per unit area. Many things have been done over the years to reduce the size of devices and improve tolerances with which they are fabricated. Such efforts have included, inter alia, fine line lithography, improved mask generation and alignment machines, improved tolerances on mask alignment, and self-aligned gates. These techniques have reduced the area required for the fabrication of the individual FET devices used in these integrated circuits. However, because of alignment tolerances, prior art FET devices must be designed with larger geometries than they would have to be if perfect mask alignment were attained. Consequently, there is a need for an improved fabrication technique for producing VLSI circuits including FET devices and conducting lines having reduced sensitivity to mask alignment and thereby affording increased density and reliability of such devices and circuits.

SUMMARY OF THE INVENTION

A process for producing VLSI (very large scale integrated) circuits employs techniques of self-aligned gates and contacts for FET devices and for both diffused conducting lines in the substrate and polysilicon conducting lines situated on isolating field oxide formed on the substrate. Mask alignment tolerances are increased and rendered non-critical. The use of materials in successive layers having different etch characteristics permits selective oxidation of desired portions only of the structure without need for masking and removal of selected material from desired locations by batch removal processes again without use of masking. There results VLSI circuits having increased density and reliability. In accordance with one embodiment of the invention, a substrate is processed so as to contain isolating field regions of silicon dioxide surrounding predetermined areas of the substrate on which active devices and diffused conducting lines are to be formed. A gate insulator and a gate electrode may be fabricated using conventional techniques, extending centrally across a predetermined area on which an active device is to be formed.

A doped polycrystalline silicon layer is applied to such a wafer and a silicon nitride layer is then applied atop the polysilicon layer. Using conventional techniques (i.e., photolithographic masking and etching), the silicon nitride layer is selectively removed from the wafer except at the regions where the source and drains are to be located and atop the region where the gate electrode lies. Since these regions are formed simultaneously by the same masking step, the only alignment problem concerns the alignment of the region over the gate electrode. However, since the region over the gate electrode only has to be sufficiently large so as to make contact with the gate electrode, its alignment tolerance is not particularly critical.

The substrate wafer, now having nitride "button" regions atop the source, gate, and drain regions of the FET device to be fabricated, is then subjected to an oxidation process which cnverts the polysilicon layer into a silicon dioxide layer everywhere but under the silicon nitride buttons. The silicon nitride buttons protect the respective, underlying portions of polysilicon and prevent their oxidation. Thus, the source, gate, and drain regions are covered by two layer buttons having a polysilicon lower layer and a silicon nitride upper layer. The remainder of the wafer surface is covered with a silicon dioxide layer. Furthermore, the oxidation process drives the dopant ions present in the remaining polysilicon layer portions overlying the source and drain regions into the surface of the bare silicon with which they are in contact with. Thus, the oxidation process simultaneously forms the doped source and drain regions as well as forming additional insulating silicon dioxide regions, termed cross-overs, separating the source and gate, and the gate and drain contact regions.

The silicon nitride buttons may then be selectively reoved by conventional batch removal means thus exposing conductive polysilicon areas to which contact can be made. It is important to note that no additional masking steps are required to remove the nitride buttons. Rather, the batch removal process is a selective etch process wherein the etchant removes the nitride but does not materially affect the non-nitride (e.g., silicon dioxide) areas. Thus, by the simultaneous fabrication of the source, gate, and drain contacts and the simultaneous doping of the source and drain regions in conjunction with the formation of the silicon dioxide isolation regions, FET devices can be fabricated in smaller areas than required for those fabricated by conventional means. The simultaneous fabrication of source, drain, and gate contacts obviates the use of multiple lithographic masking with its required guard regions necessitated by the buildup of alignment tolerances. The reduction or removal of these guard regions is what enables the smaller FET device area.

In a further embodiment of the invention, the basic techniques as summarized above are employed for developing not only transistor or other active devices but also polysilicon conducting lines on the field oxide and diffused conducting lines in the substrate, with self-aligned contacts thereto, enabling the fabrication of entire circuits. The decreased size achieved by the techniques of the invention results in highly dense packing of components and the necessary interconnects for such circuit fabrication. Such high density configurations are known as very large scale integrated (VLSI) circuits. As greater miniaturization is achieved, of course, the criticality of mask alignment and thus decreased tolerance to mask misalignment introduces limiting factors on the ability to achieve the desired density and thus VLSI circuit requirements. The processes and the resulting products of the invention, by increasing mask tolerance and through use of self-aligned gates and contacts, and through use of selective etching or material removal techniques permitting elimination of certain masks, contributes to the realization of VLSI circuits.

In accordance with further embodiments of the invention, both the gate oxide layer and a silicon nitride layer are formed on the surface of a silicon substrate on areas in which active devices, e.g., FETs, and diffused conducting lines are to be formed, surrounded by field oxide. A polysilicon layer formed on the nitride layer, is delineated to provide the polysilicon conductor of a gate, i.e., the gate electrode; it then may be oxidized on its exposed surface in reliance on the masking effect of the nitride layer. This affords minimal oxide layer thickness on the gate polysilicon layer and again contributes to the reduced device size. Silicon nitride pads, or buttons, can be formed over source and drain regions, polysilicon contact areas and diffused line contact areas, to permit thermal oxidation of the surface of such regions and conducting lines for insulation purposes. Thereafter, a material selective etch is employed to remove the nitride pads and thus provide a self-aligned contact surface for interconnection purposes.

The processes of the invention permit direct contact to the gate electrode as well as floating gate and remote gate contact configurations. Diffused conducting lines permit a first level interconnect to source and drain, as well as being compatible with a direct gate contact configuration. Conversely, a remote gate contact with direct source and drain contacts may be afforded. Theoretically, simultaneous and direct source, gate, and drain contacts may be provided although current technology limits the miniaturization of device size and configuration by virtue of the required dimensions of the conducting lines in such a simultaneous direct contact device configuration.

These and other objects and advantages of the invention will be apparent from the following detailed description of certain preferred embodiments thereof.

DESCRIPTION OF THE PREFERRED EMBODIMENTS

Figure 1:
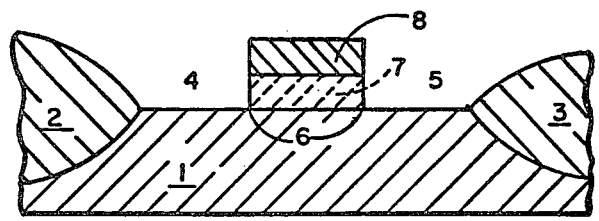
FIG. 1 illustrates a partial cross-sectional view of a semiconductor substrate wafer prior to the fabrication technique in accordance with the present invention.

FIG. 1 illustrates a partial cross-sectional view of the semiconductor substrate after having undergone earlier processing. While the substrate 1 is illustrated as comprising a single piece of N or P type silicon, it is to be understood that a composite wafer comprising, for example, silicon-on-sapphire could also equally be used with the process in accordance with the present invention. By previous procedures, silicon dioxide field layers 2 and 3 have been thermally grown on a silicon layer 1. Apertures 4 and 5 have been provided by conventional masking techniques. An area 6, as illustrated in the center of FIG. 1, will ultimately be defined to be the gate region and contains the channel of the FET device to be fabricated. A silicon dioxide gate insulator layer 7 and polycrystalline silicon layer 8 (polysilicon) have been provided atop the gate region 6. The polysilicon layer 8 can either be previously doped or may be doped at a later time, depending on its desired electrical characteristics. The silicon dioxide layer 7 has been previously fabricated so as to form the gate insulator region of the FET while the poysilicon layer 8 serves as the gate electrode of the FET.

Figure 2:
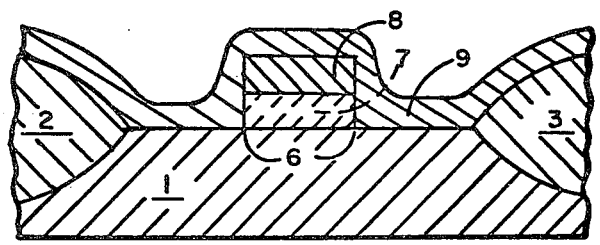
FIG. 2 is a partial cross-sectional view of the wafer illustrated in FIG. 1 after the deposition of a polysilicon layer.

A polycrystalline silicon (polysilicon) layer 9 is then deposited atop the surface of the substrate 1. FIG. 2 illustrates the substrate 1 after the deposition of the polycrystalline silicon layer 9. The polycrystalline silicon layer 9 can be deposited by means of a chemical vapor deposition technique, for example, and the polycrystalline silicon used is of a doped variety using such dopants as arsenic, boron, phosphorus, etc.

Atop the polysilicon layer 9 is deposited a silicon nitride layer 10. This silicon nitride layer 10 will ultimately be delineated and remaining portions thereof will be used to prevent the oxidation of the underlying regions of the polysilicon layer 9 during thermal oxidation of exposed areas thereof.

The delineation of the nitride layer 9 is performed by a conventional masking process. A layer of photoresist is applied atop the silicon nitride layer 10. This photoresist layer is then exposed to actinic radiation through a photolithographic mask. The areas of the photoresist not receiving the actinic radiation because of the shielding of the mask are rendered soluble in an appropriate developer solution whereas the areas exposed to the actinic radiation are rendered non-soluble in the same developer solution. Thus, by processing the substrate 1 in the appropriate developer solution, selected portions of the photoresist layer are left on the surface of the nitride layer 10. The photolithographic mask is arranged so as to render the photoresist layer non-soluable ble over those regions of the wafer wherein the source, gate and drain contacts are to be located. Thus, after processing the substrate 1 in the appropriate developer, photoresist regions will protect the nitride layer in the regions where source, gate, and drain contacts are to be located.

Figure 3:
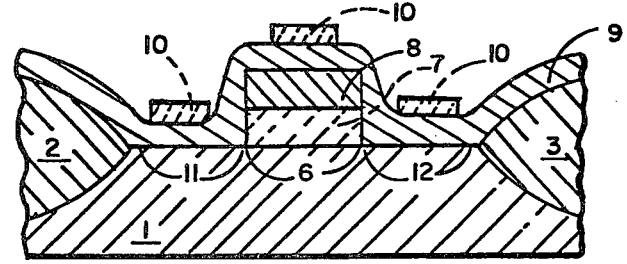
FIG. 3 is a partial cross-sectional view of the wafer of FIG. 2 illustrating the silicon nitride buttons atop the polysilicon layer.

The wafer 1 is then subjected to a nitride layer removal process (i.e., etching) to selectively remove the nitride layer 10 not covered by the remaining photoresist layer. After the nitride layer removal step, the remaining photoresist layer is removed by conventional means. The cross-section of the silicon substrate 1 would then appear as illustrated in FIG. 3. Portions of the silicon nitride layer 10 have been left in the region atop the gate area 6 as well as in the regions atop what will subsequently be defined as the source and drain regions 11 and 12 of the FET device.

Figure 4:
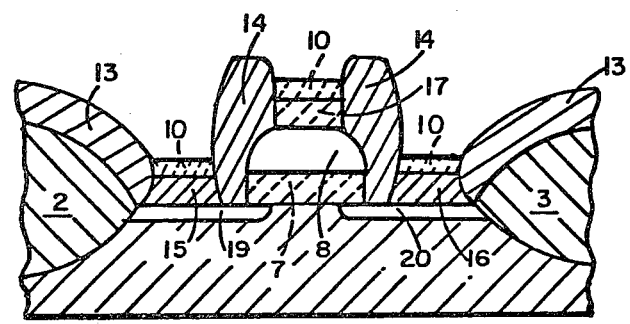
FIG. 4 is a partial cross-sectional view of the wafer of FIG. 3 after being subjected to an oxidation process.

The substrate 1 is then subjected to a thermal oxidation process which converts the exposed polysilicon layer 9 into silicon dioxide. However, substantially all of the polysilicon layer located under the remaining portions of the nitride layer 10 is protected from oxidation and therefore remains in its original non-oxidized state. As illustrated in FIG. 4, the edges of the gate polysilicon layer 8 in contact with the polysilicon layer 9 are oxidized to some extent by the oxidation process. Furthermore, the same oxidation process drives some of the dopant ions, initially present in the polysilicon layer 9, into the source and drain regions 11 and 12 of the silicon substrate 1. The gate polysilicon layer 8 may also be doped by this process. Thus, the oxidation process simultaneously forms the doped junctions of the FET device and converts the exposed polysilicon to silicon dioxide. FIG. 4 illustrates the wafer after the oxidation process. The polysilicon layer 9 has been oxidized in silicon dioxide regions 13 and 14 which serve to passivate the source and drain regions 11 and 12 and provide electrical isolation between the source, drain, and gate contact regions. Note that polysilicon regions 15, 16, and 17, located respectively beneath the source, drain, and gate regions, have not been converted to silicon dioxide. Regions 19 and 20 are the now doped source and drain regions of the FET device.

The silicon nitride regions are of course directly over the source and drain regions since they were used to mask the polysilicon layer 9 during the formation of the source and drain regions. Since they were formed simultaneously, the only alignment problem was the non-stringent alignment tolerance of the photolithoghraphic mask with respect to the previously formed gate region. The nitride region above the gate area, while not used to form the gate insulator or gate electrode, also does not require a very precise alignment tolerance in its placement since it merely defines an area to which a gate contact will later be formed. Thus, there is no buildup of alignment tolerances and the one alignment tolerance is not stringent.

The silicon nitride regions are then selectively removed, typically using a phosphoric acid etching process or plasma etching process. The substrate 1 now contains a completed FET device having conductive polysilicon regions over the source, drain, and gate areas. These conductive regions are considerably larger than needed for the final electrical connections thereto. Thus, there is no high accuracy alignment required when fabricating the smaller metalization layer interconnects on top of the larger polysilicon contact areas. Furthermore, the process according to this invention has ensured the proper placement of a silicon dioxide film as part of the side wall of the FET junctions to provide electrical isolation as well as reducing the junction capacitance and thereby providing a low capacitance structure to enhance the speed of the performance of the FET device. This is particularly important in metal oxide semiconductor devices for use in N channel MOS type circuits. In addition, the fact that the contact regions are surrounded by an insulating region (i.e.-silicon dioxide layer) allows for non-stringent alignment of the subsequently applied conductor layer.

The resultant structure then is processed by conventional techniques which, for example, would include:
1-Applying a metalization layer.
2-Applying a photoresist layer atop the metalization layer and exposing the photoresist layer to actinic radiation through a metalization contact mask. It is important to note that the metalization contact mask does not require stringent alignment tolerances since the process according to the present invention can produce relatively large polysilicon contact areas for the source, gate, and drain regions. Furthermore, since these source, drain, and gate contact regions are separated by an insulating silicon dioxide layer, one only has to ensure that the interconnections formed by the metalization layer do not inadvertently contact more than one interconnection region.
3-The unwanted photoresist layer is then removed and the metalization layer is selectively etched to produce the various necessary interconnections.
4-The metalization layer is annealed and the wafer then subjected to conventional final processing steps.

Figure 5:
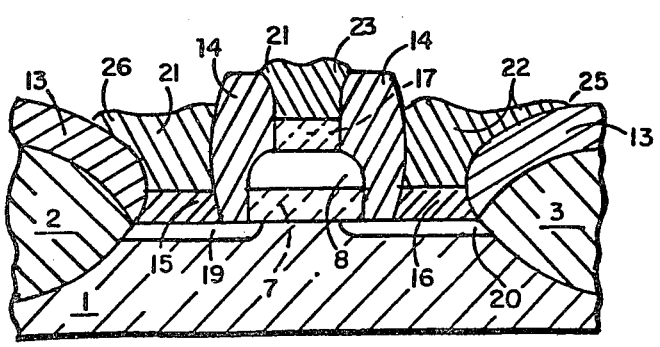
FIG. 5 is a partial cross-sectional view of the wafer of FIG. 4 after the nitride buttons have been removed and the metallized interconnections added.

FIG. 5 illustrates the wafer after the nitride buttons 10 have been removed and the metalization layer applied and selectively removed by the above-noted masking steps. Metalized interconnections 21-23 are shown in direct contact with polysilicon contact regions 15-17, respectively. The silicon dioxide crossover regions 14 serve to electrically insulate the metalized interconnections 21-23 from each other. Furthermore, because the surface of the processed wafer is protected by an electrical insulator (i.e., silicon dioxide), any misalignment of the metalization mask, causing overhangs (e.g., 24-26 as illustrated in FIG. 5) of the metalized interconnections do not necessarily short out the device rendering it inoperable.

Figure 6:
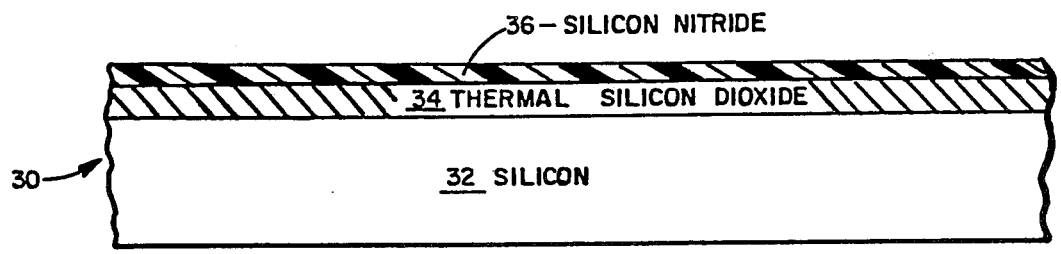
FIG. 6 is a partial cross-sectional view of a semiconductor substrate wafer, prior to device fabrication and in accordance with a further embodiment of this invention.

A process in accordance with a further embodiment of the present invention starts with a wafer 30 of (100 oriented) P-type monocrystalline silicon 32. A thermal silicon dioxide layer 34 is grown on the entire surface of the wafer to a depth of approximately 800 Å. A silicon nitride layer 36 is then deposited over the entire wafer to a depth of approximately 575 Å. The wafer at the end of this step is illustrated in cross section in FIG. 6.

Figure 7:
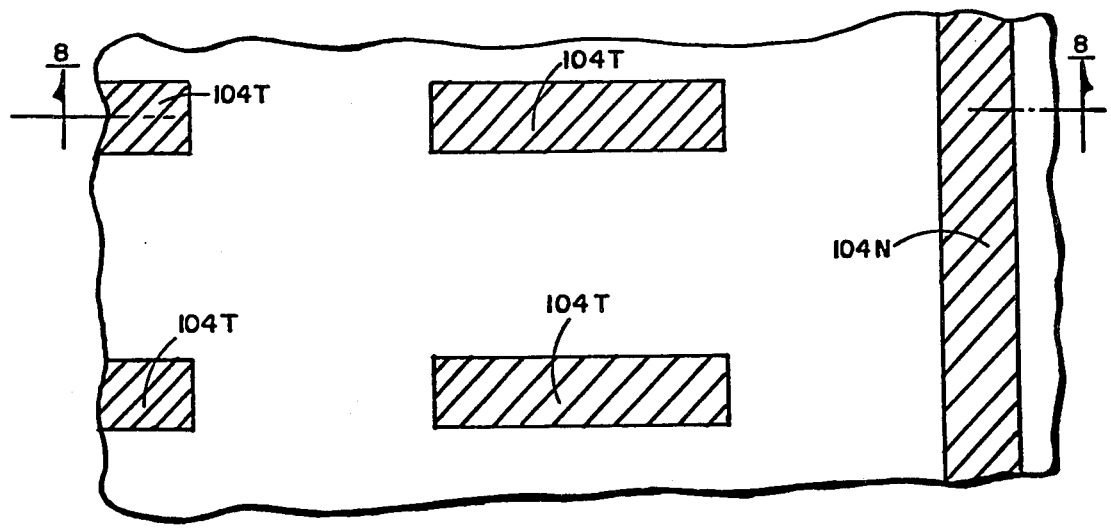
FIG. 7 is a plan view of a mask used for processing the wafer structure of FIG. 6.
Figure 8:
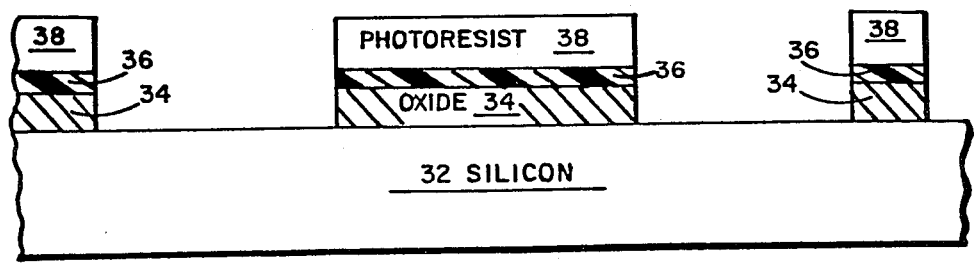
FIG. 8 is a cross-sectional view of the wafer of FIG. 6, taken along line 8—8 in FIG. 7, indicating the structure resulting from processing in accordance with the mask of FIG. 7.

A layer 38 of photoresist is disposed on the silicon nitride layer 36 and exposed to actinic radiation through an isolation or N mask 100 (FIG. 7) having protective portions 104 wherever it is not desired to have field oxide and, particularly, when active devices or diffused lines are to be provided in the substrate. Mask region 104T is over the future location of a field effect transistor and the mask region 104N is over a future N-type conductive interconnection line. The protective portions 104 of the N-mask are opaque or transparent in accordance with the type of resist being utilized and result in the photoresist thereunder being rendered non-soluble while the remainder of the photoresist is rendered soluble. Following the exposure of photoresist, the photoresist is developed to remove the soluble portions of the photoresist. The portions of the silicon nitride layer 36 which are left unprotected by the removal of the soluble photoresist are removed in an appropriate manner. The portions of the silicon dioxide layer 34 which are uncovered by the removal of the unprotected portions of the silicon nitride film are removed in an appropriate manner and the wafer appears in cross section as illustrated in FIG. 8.

Figure 9:
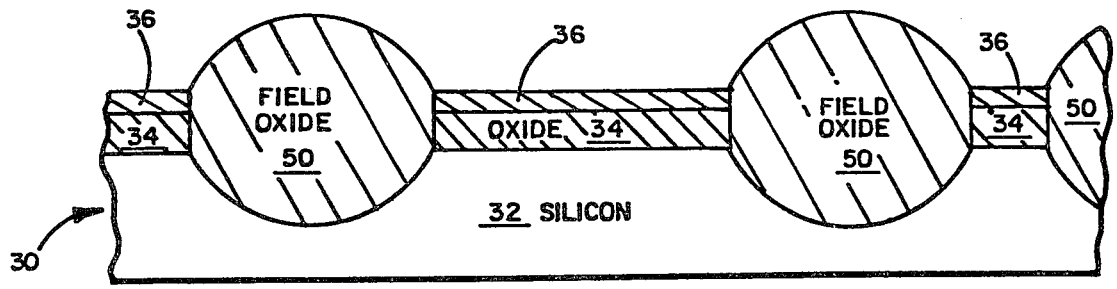
FIG. 9 is a cross-sectional view corresponding to that of FIG. 8 illustrating the development of a field oxide.

Next the remaining photoresist material 38 is removed from the wafer 10 and the wafer is exposed to thermal oxidation conditions to grow a field oxide 50 to a depth of approximately 9,000 to 12,000 Å on those portions of the wafer surface which are not protected by a silicon nitride film. FIG. 9 illustrates the wafer at the end of this step.

Following the growth of the field oxide 50, the remainder of the silicon nitride layer 36 is removed in an appropriate manner. The remainder of silicon dioxide layer 34 is also removed and the wafer appears as in FIG. 10.

The wafer is exposed to thermal oxidation conditions to regrow a gate oxide layer 54 on the now exposed portions of the silicon wafer. This gate oxide preferably has a depth of approximately 800 Å. A second silicon nitride film 56 is then deposited over the entire surface of the wafer and exposed to oxidizing conditions to form a silicon oxynitride film 58 on the surface of silicon nitride layer 56.

A polysilicon layer 60 is deposited on silicon nitride layer 58 to a depth of approximately 7,500 Å. This polysilicon layer is doped N-type. A silicon dioxide film 62 is thermally grown on the surface of the polysilicon 60 to a depth of approximately 1,000 Å, and the wafer appears as in FIG. 11.

Figure 12:
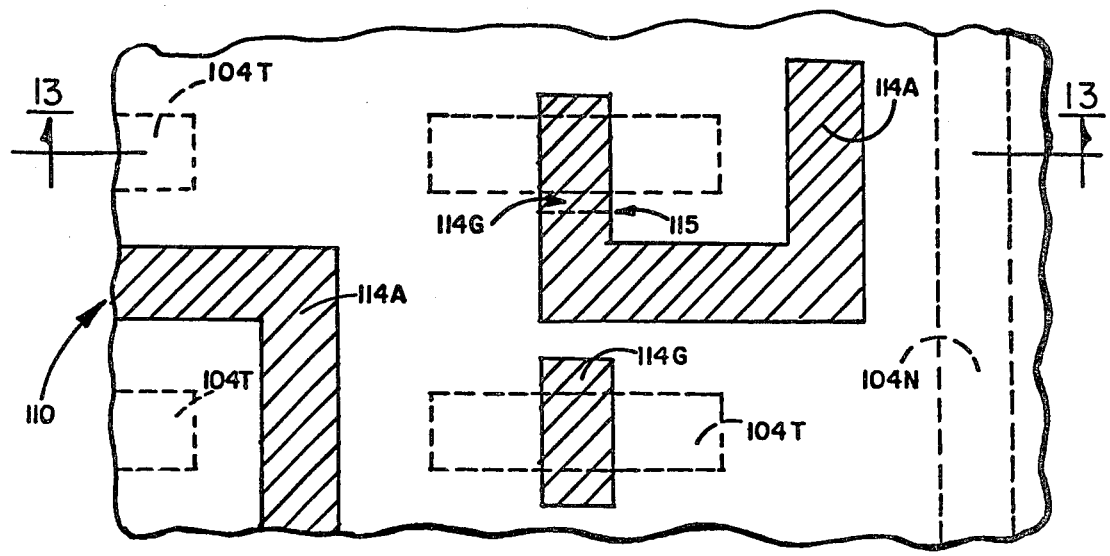
FIG. 12 is a mask for delineating polysilicon portions, such as in the gate and for a conducting line on a field oxide, from the polysilicon layer of FIG. 11.

A photoresist layer 64 is formed on the wafer 30 and exposed to actinic radiation through a gate mask 110. Gate mask 110 is illustrated in FIG. 12. Mask 110 has protective portions 114 where polysilicon 60 is to be retained over the gate region (portion 114G) or as a conductive path for use in interconnecting devices (portion 114A). In FIG. 12, one portion 114G and portion 114A are shown connected at 115 to form a continuous region in order to provide a remote contact to the polysilicon of the gate. The other illustrated region 114G is not connected to a region 114A because the gate there will be left floating. The connection of regions 114A and 114G is optional and a function of circuit design. The alignment of mask 110 with the underlying structure is illustrated by regions 104T and 104N of mask 100 whose locations are shown in phantom. After the photoresist is developed, the silicon dioxide layer 63 has its unprotected portions removed in an appropriate matter. Portions of the polysilicon layer 60 which are uncovered by the removal of the silicon dioxide are removed in an appropriate manner. The method used to remove the polysilicon is preferably self-terminating at the surface of the silicon oxynitride layer 58. After removal of the unprotected polysilicon, the wafer appears as in FIG. 13.

Figure 14:
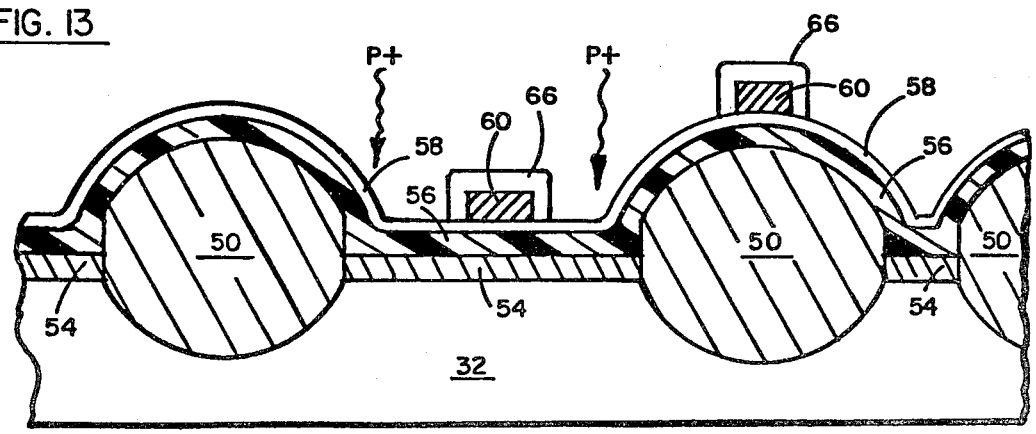
FIG. 14 is a cross-sectional view as in FIG. 13, illustrating the results of thermal oxidation to develop an oxide on the polysilicon layer of the gate and on a polysilicon line, and the masking effect thereof during doping of the source and drain and diffused conducting line.

After the unprotected polysilicon has been removed, the remaining photoresist material is removed from the wafer and the polysilicon material which remains is thermally oxidized to form a silicon dioxide layer 66 approximately 5,000 Å thick and the wafer appears as in FIG. 14. It is significant to note that the nitride layer 56 is not readily oxidized and thus its previously provided oxynitride layer 58 does not increase significantly in thickness during the development of the thermal oxide coatings 66 on the polysilicon lines 60. The thickness of coating 66 is made slightly greater than that necessary for ultimate electrical insulating and integrity characteristics due to subsequent oxide etching steps which are performed without masking, for removal of the relatively much thinner gate oxide layer 54 during which a portion of the layer 66 is etched away. Also, in a subsequent processing step, the oxynitride layer 58 will require first an oxide etch prior to the nitride etch to remove the nitride layer 56 in certain predetermined areas; as well, the oxynitride etch will effect some slight etching of the polysilicon oxide layer 66 but will have no deleterious effect due the relative thicknesses of these two oxide layers.

The source and drain regions of the active device to be formed between the two isolating areas of field oxide 50 as seen in FIG. 14 thus are defined as underlying those portions of the selected area defined by the mask portion 104T (see FIG. 7) which are not part of the composite gate structure which ultimately will be formed, and which will include the gate polysilicon 60 and its associated thermal oxide layer 66 and the corresponding lateral extent of the underlying oxynitride layer 58, nitride layer 56, and the underlying silicon dioxide layer 54.

Doping of the source and drain regions is achieved by an implantation of phosphorus, or alternatively of arsenic, using a 400 keV implanter at high dosages, illustrated schematically in FIG. 14 by the curved arrows and the designation "P+", the doping of the diffused conducting line being similarly indicated. The resulting implant is indicated by dash lines underlying the source, drain and conducting line cross-sectional areas as seen in FIG. 14. It is significant that during this ion implant operation, the thick oxide coating 66 on the polysilicon 60 prevents doping thereof whereas the nitride does not impede the doping of the desired regions.

Figure 15:
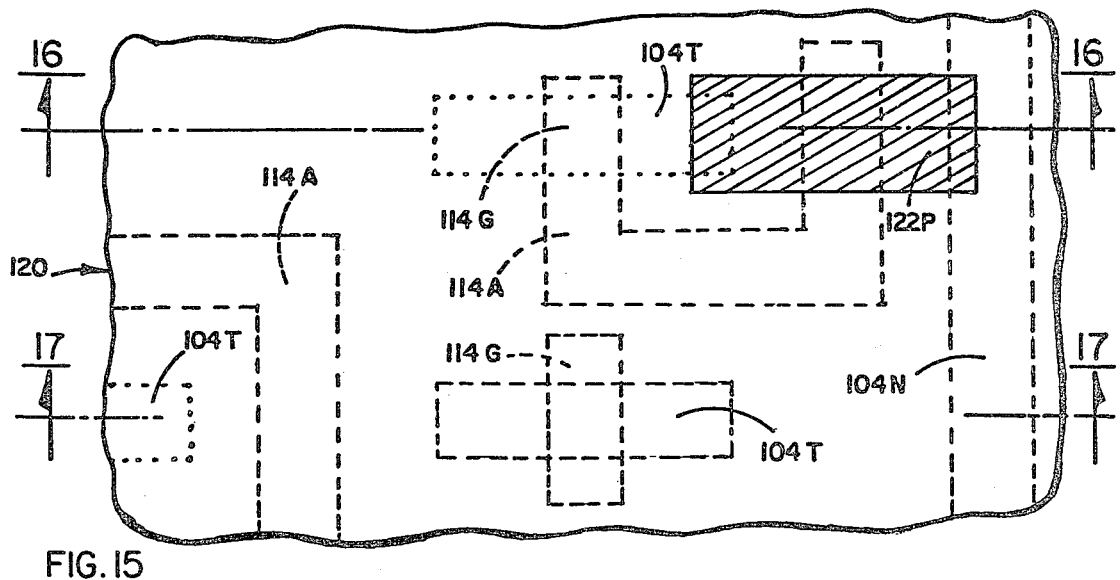
FIG. 15 is a plan view of a mask for opening contacts to polysilicon lines on the field oxide.

Following the doping, an additional layer 68 of photoresist is formed on the wafer and exposed to actinic radiation through a polysilicon contact mask 120 which is illustrated in FIG. 15. Mask 120 has nonprotective portions where it is desired to form contacts to the polysilicon, or a connection line (portion 122P). The alignment mask 120 is shown by phantom outlines of mask 100 portions 104T and 104N and mask 110 portions 114G and 114A. After development of photoresist 68, the oxide 66 over the polysilicon is unprotected at those locations 70 which were in alignment with mask portions 122, that is, where it is desired to provide contacts to the polysilicon as shown at 70P in FIG. 16. This unprotected silicon oxide is removed in an appropriate manner and the wafer appears in cross-section as in FIGS. 16 and 17, with the sections taken along line 16—16 and 17—17 in FIG. 15, respectively.

Figure 16:
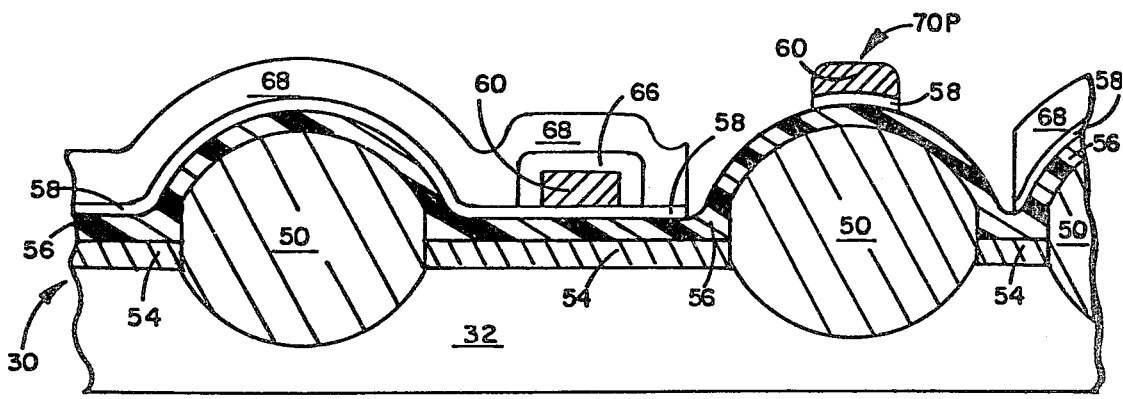
FIG. 16 is a cross-sectional view along lines 16—16 in FIG. 15, illustrating a contact opened to a polysilicon line on the field oxide.
Figure 17:
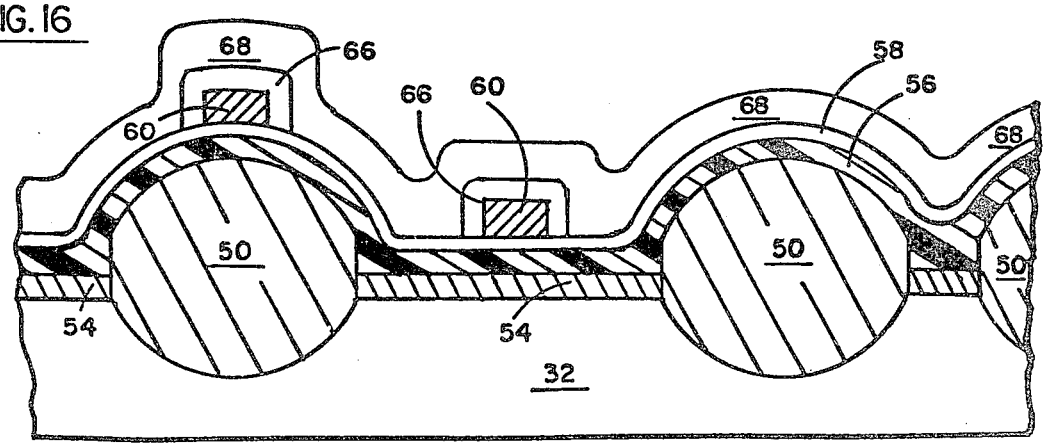
FIG. 17 is a cross-sectional view along line 17—17 in FIG. 15, illustrating the configuration of a floating gate FET device structure.

The alignment of mask 120 for the contact region 122P has substantial tolerance, the primary requirement being that the opening 70P not overlap oxide 66 of any other retained polysilicon portions; thus, this opening is essentially self-aligning. After the unprotected portions of oxide 66 have been removed, thereby providing exposed contact areas to the polysilicon line as seen in FIG. 16, the remaining portions of photoresist 68 are removed.

Figure 18:
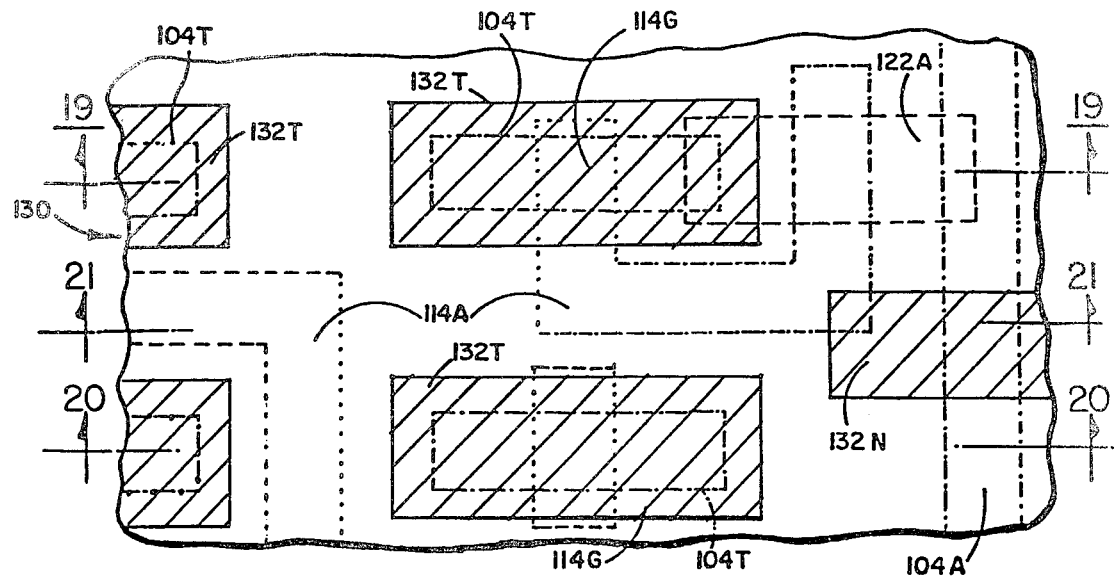
FIG. 18 is plan view of a mask for photolithographic processing of the structure of FIGS. 16 and 17.

An additional photoresist layer 72 is formed on the wafer and exposed to actinic radiation through an N-type contact mask 130. Mask 130 is illustrated in FIG. 18. Mask 130 has non-protective portions 132, both in the vicinity of the source and drain regions (portions 132T) and in the vicinity where contacts to N-type conductive lines are desired (portions 132N). The alignment of mask 130 with the underlying structure is illustrated by phantom outlines of the portions 104T and 104N of mask 100, portions 114G and 114A of mask 110, and portion 122P of mask 120. In order to allow for mask misalignment, portions 132T are larger than the source and drain areas and portions 132N are wider than the conductive N+ lines.

After development of the resist, the silicon oxynitride layer 58 is unprotected over the source and drain regions and over those location of the N-type conductive lines where it is desired to make contacts to the silicon material. The unprotected portions of the silicon oxynitride 58 are removed from the surface of the silicon nitride 56 in an appropriate manner. As before referenced, the removal of the silicon oxynitride 58 does effect some etching of the now unprotected oxide 66 of the gate polysilicon 60; however, due to the increased thickness of the oxide 66 as provided for this purpose, this has no deleterious effect. The uncovered silicon nitride 56 is removed in an appropriate manner. The portions of the gate dielectric 54 which become unprotected as a result of the removal of the unprotected silicon nitride are removed in an appropriate manner thereby uncovering the semiconductor material of the source and drain regions and N-contact areas. Likewise, as before noted, the relative much thinner oxide layer 54 is etched away very rapidly compared to the extent of etching of the polysilicon oxide 66 and thus there is no deleterious effect on the latter during removal of the exposed portions of oxide layer 54. The wafer now appears as illustrated in cross-section in FIGS. 19, 20 and 21 which are taken along section lines 19—19, 20—20, and 21—21, respectively in FIG. 18.

Figure 19:
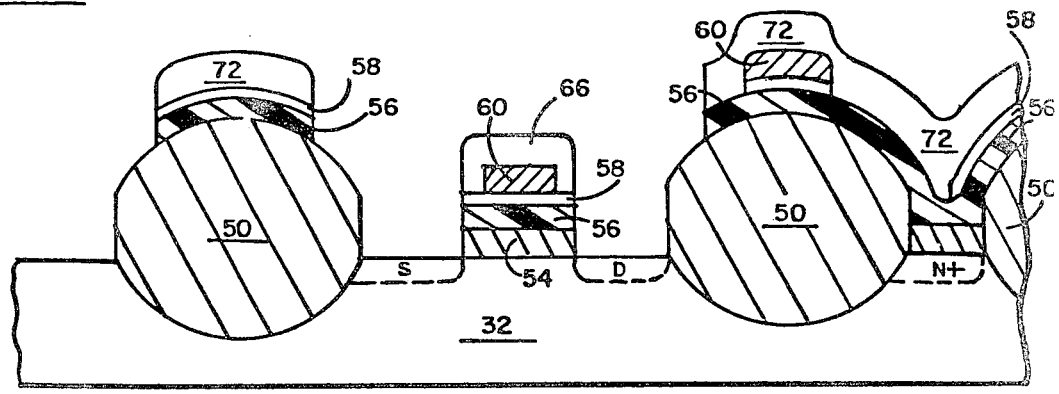
FIGS. 19, 20 and 21 are cross-sectional views taken along the lines 19—19, 20—20 and 21—21 of FIG. 18, illustrating the resulting structures after selectively removing the nitride and gate oxide layers from portions not protected by an overlying photoresist layer used in the lithographic process, functioning thereby to expose the substrate in the source and drain regions (FIGS. 19 and 20) and in the diffused conducting line region (FIG. 21).
Figure 20:
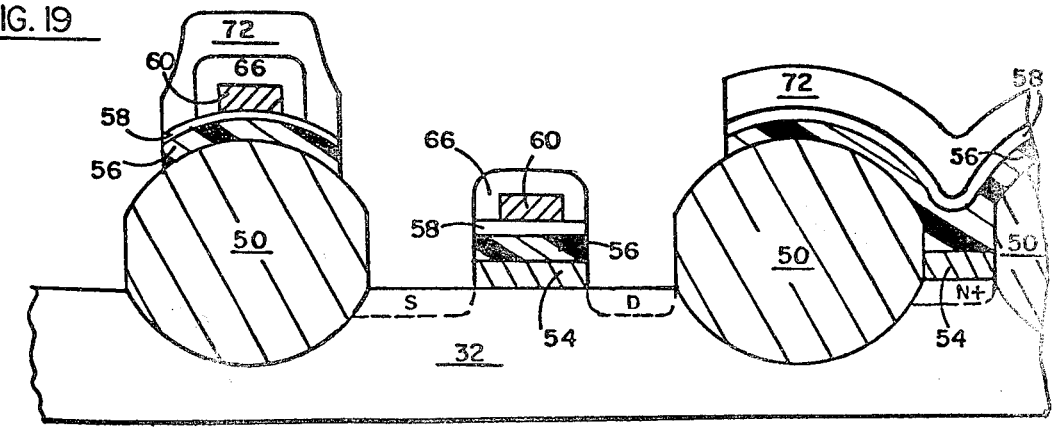
Figure 21:
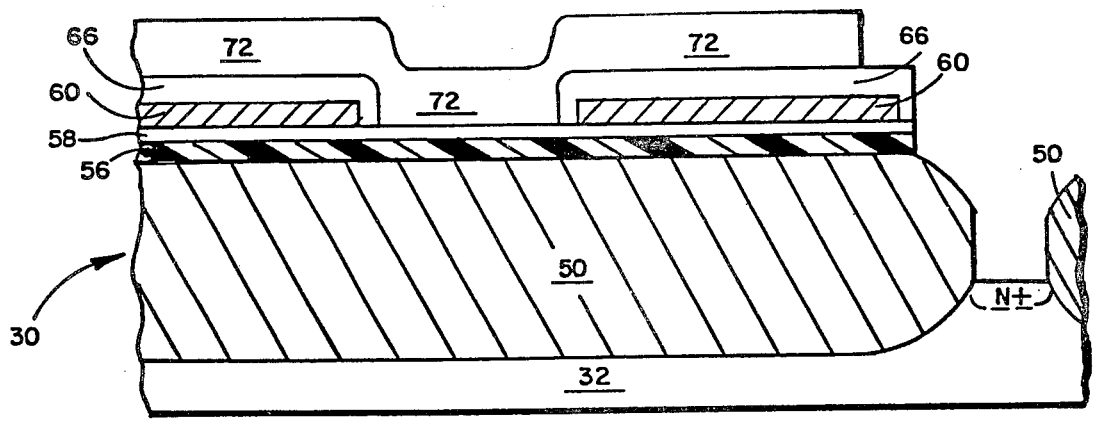

After opening of the contact areas to the substrate 32 and thus for the source and drain regions seen in cross-section in FIGS. 19 and 20 and the conducting lines seen in cross-section in FIG. 21 the substrate is subjected to an activation, or drive cycle to diffuse the source and drain regions and the N+ conducting line region and produce the diffused regions as schematically illustrated in FIGS. 19 through 21.

Figure 22:
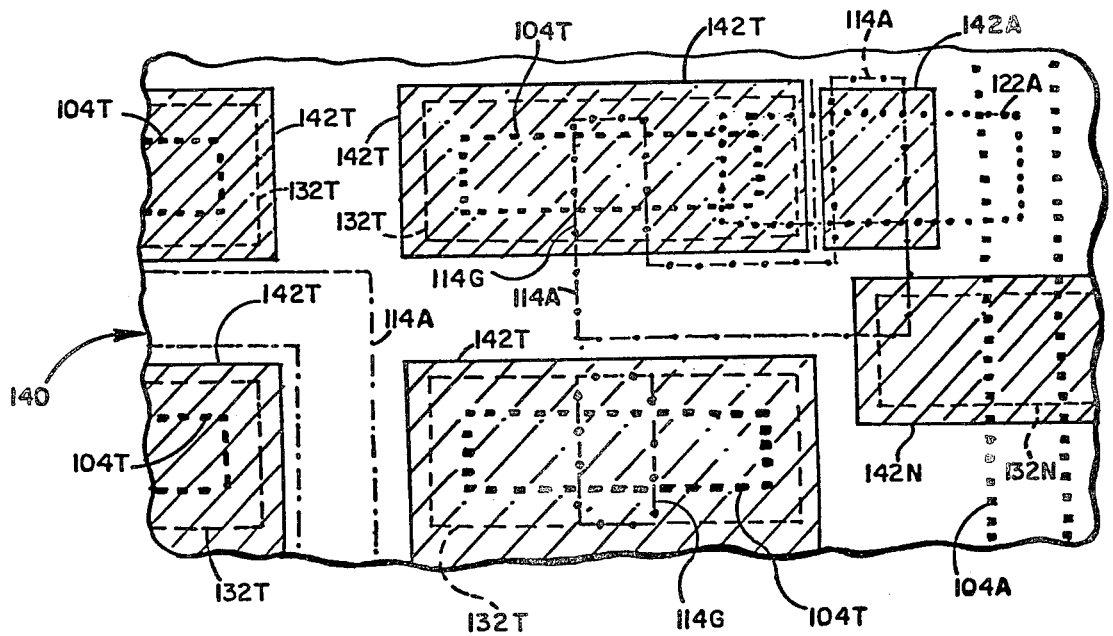
FIG. 22 is a plan view of a mask for providing openings through a Silox (insulating) layer applied to the structure of FIGS. 19-21 to provide increased electrical insulation.
Figure 23:
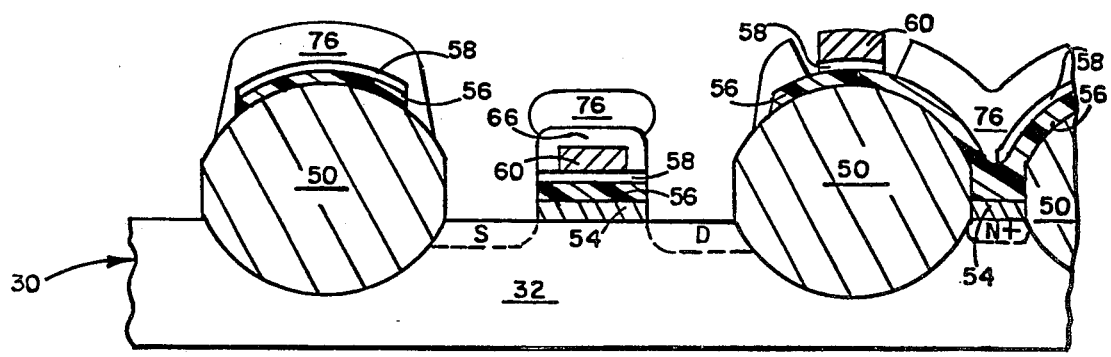
FIGS. 23, 24, and 25 illustrate the masking processing of the structure of FIGS. 19-21, respectively, after over-sized windows have been opened to the substrate surface in the source and drain and diffused conducting line areas, or regions, and to the contact of the polysilicon line on the field oxide.
Figure 24:
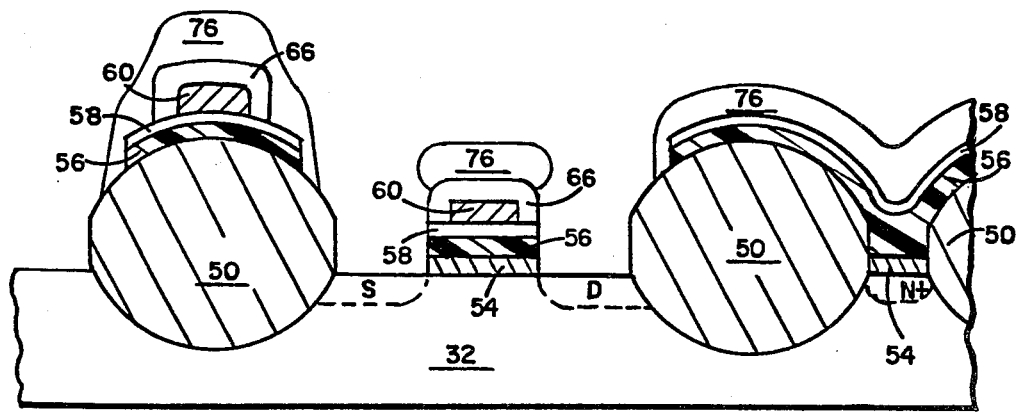
Figure 25:
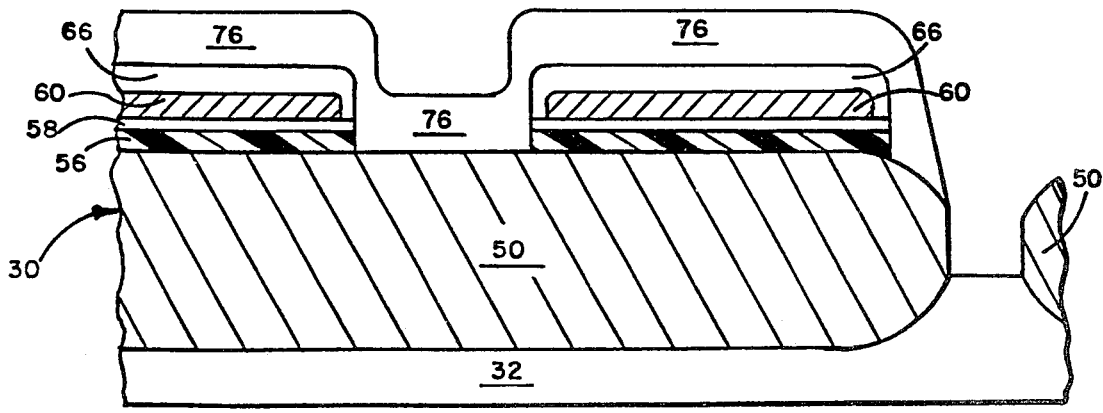

The remaining photoresist 72 is then removed and a silicon dioxide (e.g., Silox (trademark)) layer 76 having 6 to 8% phosphorus content is deposited by conventional CVD techniques over the entire wafer. A photoresist layer 78 (not shown) is provided on the Silox layer 76 and exposed to actinic radiation through a contact mask 140 which is illustrated in FIG. 22. Mask 140 has non-protective portions 142 over the field effect transistors (142T), over the regions where contacts to the polysilicon are to be formed (142P) and over the regions where contacts to the N+ lines are to be formed (142N). The alignment of mask 140 is illustrated by the phantom outlines of the portions 104T and 104N of mask 100, portions 114A and 114G of mask 110, portion 122P of mask 120, and portions 132T and 132N of mask 130. For the circuit configuration illustrated, the alignment of mask 140 must be such that the protective region where the Silox is retained thereunder, between non-protective region 142T and the portions of polysilicon 60 to which contact is to be made, will isolate the latter from the adjacent source or drain region, while leaving enough of each exposed to assure good metalization contacts to the exposed silicon of the adjacent source and/or drain regions, and to the polysilicon 60. The protective region between 142N and the adjacent region 142T must lie where it isolates the N contact from the adjacent source or drain. Similarly, the protective region between region 142P and the adjacent region 142N must isolate the polycontact region from the N contact region. After the photoresist layer 78 is developed, the portions of Silox layer 76 over the field effect transistors, the poly line contact regions and the N+ diffused line contact regions are unprotected. The unprotected Silox 76 is removed in an appropriate manner and, after removal of the resist 78, the wafer appears as in FIGS. 23 to 25. The cross-sectional views of FIGS. 23 to 25 respectively correspond to the views of FIGS. 19 through 21.

It should be appreciated that the Silox layer 76 is provided as an added safeguard, inasmuch as the surfaces over which the Silox is applied are sufficient in and of themselves to provide electrical insulation. However, the Silox does afford a greater tolerance for the metalization mask employed in the definition of conductors which contact the various contact areas. In addition, the Silox provides additional dielectric over the conducting elements, such as polysilicon line 60 including the gate polysilicon of the active device, whereby conductive lines (e.g., metalization) applied thereover as may occur on the field region or by overlap of source and drain contact conductors onto the gate oxide, do not produce capacitive coupling to the gate electrode, as might occur if only the thinner layer of polysilicon oxide 66 were relied upon for this insulating purpose.

Figure 27:
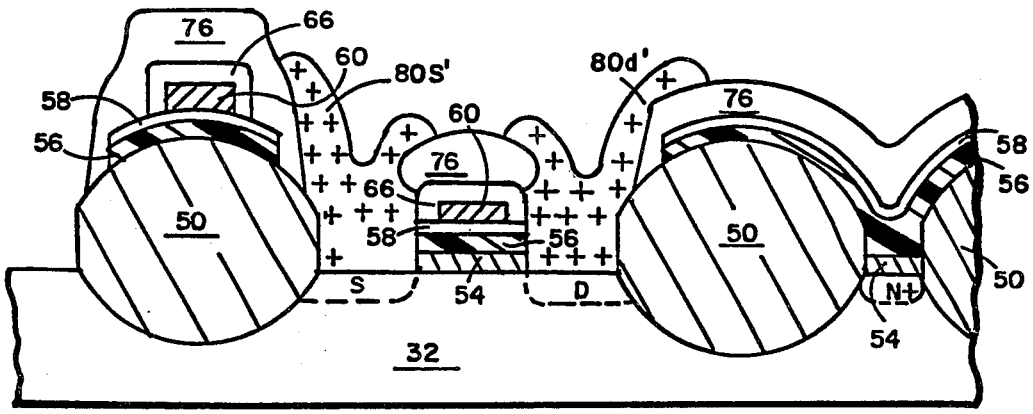
Figure 28:
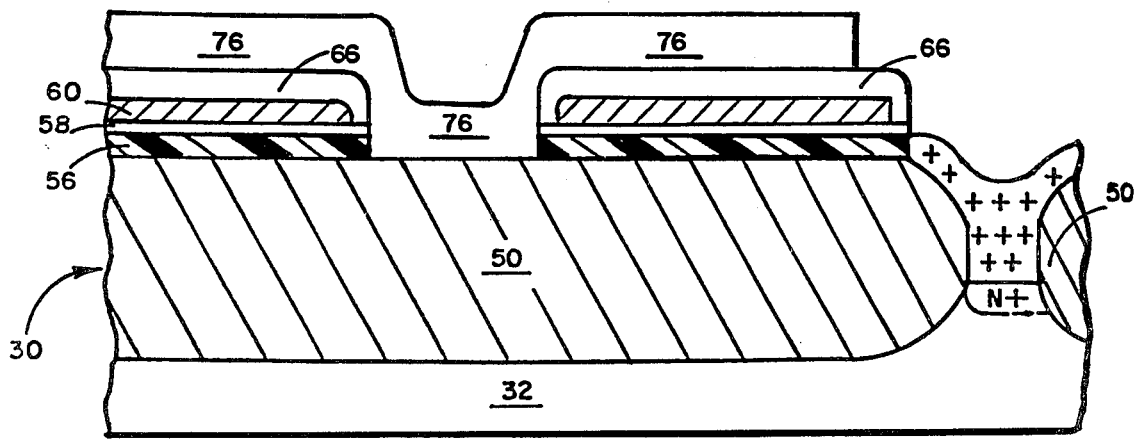

Inasmuch as the desired metalization pattern for conductive lines is non-critical, no such mask has been illustrated in these figures. Nevertheless, FIGS. 26 through 28 do provide cross-sectional illustrations of the formation of metalization. Prior to the metalization, it is preferred that a reflow cycle be performed to smooth in the edges of the Silox and thus provide a better surface for application of the metalization layer.

Figure 26:
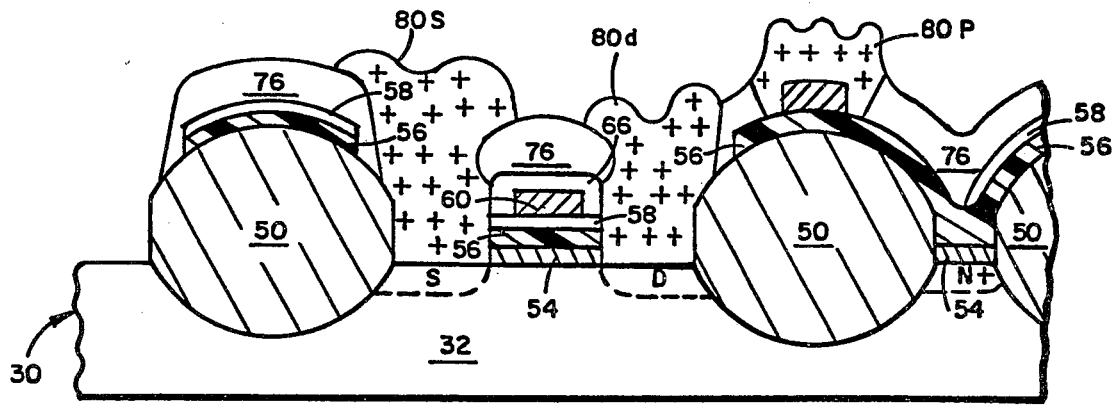
FIGS. 26, 27, and 28 are cross-sectional views corresponding to those of FIGS. 23 through 25, respectively, showing the disposition of metal conducting lines on the exposed contact surfaces of the structure.

In FIG. 26, the metal contacts to the source and drain regions are indicated at 80S and 80D, respectively, and the metal contact of the poly line 60 is indicated at 80P. As before noted, the Silox layer 76 affords increased dielectric spacing between the metal conductors and the gate electrode, for example, as may readily be seen in FIG. 26.

As is apparent from the cross-sectional size of the conductors, the "windows" or openings formed by the metalization mask through the Silox layer may be substantially over-sized relative to the contact areas to the source and drain, and diffused conducting line.

The process and techniques of the invention may also be employed to provide a direct contact to the gate structure. Whereas it is at least theoretically possible in accordance with the teachings of this invention to provide direct contacts to each of the source, gate, and drain regions of an FET, as a practical matter the spacing of the simultaneous direct contacts becomes so critical that this does not recommend itself as a practical production technique with the current state of technology. Hence, the following discussion will illustrate only the provision of a direct gate contact with remote source and drain connections provided illustratively through diffused lines constituting, in essence, extensions of the diffused regions forming the source and drain.

Figure 29:
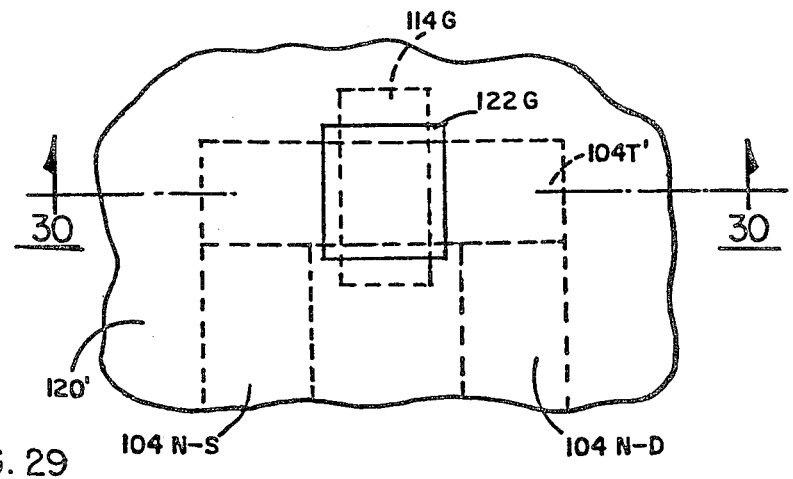
FIG. 29 is a plan view, partly in schematic form, illustrating the configuration of a transistor formed in accordance with the invention and having a direct gate contact and diffused conducting line associated with the source and drain regions.

In FIG. 29, the mask 120 of FIG. 15 is shown in altered fashion as mask 120' to include a diffused line 104N-S connecting to the source and 104N-D connecting to the drain of the FET defined at 104T'. The outline of the gate area defined by mask portion 114G of mask 110 of FIG. 12 remains as before. The mask portion 122G defines an area in which an underlying photoresist layer will not be protected and thus will be removed. Particularly, the mask 120' of FIG. 29 would be used in conjunction with a photoresist layer applied over the structure formed in accordance with the process of this invention as shown in FIG. 14. Mask portion 122G of FIG. 29 would serve to remove the photoresist material overlying the gate polysilicon layer 60 and its associated oxide 66 so as to permit an etchant to remove the oxide layer 66 to achieve the direct gate contact. Particularly, with reference to the cross-sectional view of FIG. 30 taken along line 30—30 and FIG. 29, the photoresist 68 is removed in the region 70G to expose the silicon dioxide layer 66 surrounding the gate polysilicon layer 60. In the gate region, an oxide etch may therefore be employed to remove the silicon dioxide layer 66 and expose the polysilicon layer 60 of the gate region.

Alternative process steps may then be employed as desired to complete the structure. For example, since N+ diffused lines will provide external connection to source and drain regions, there is no need to remove the nitride layer 56 or its associated oxynitride layer 58, or the underlying gate oxide layer 54 from the surfaces of the source and drain regions, since no direct contact thereto will be required in this configuration. Alternatively, the drain and source may be delineated in accordance with processing as shown in FIGS. 18 through 20 such that the source and drain regions are exposed. In this instance, mask portion 122G of FIG. 29 must be confined more precisely to be in alignment with the gate structure and, particularly, preferably opens a window of approximately the same width as the width of the polysilicon line 60 through the overlying silicon dioxide layer 66.

Figure 31:
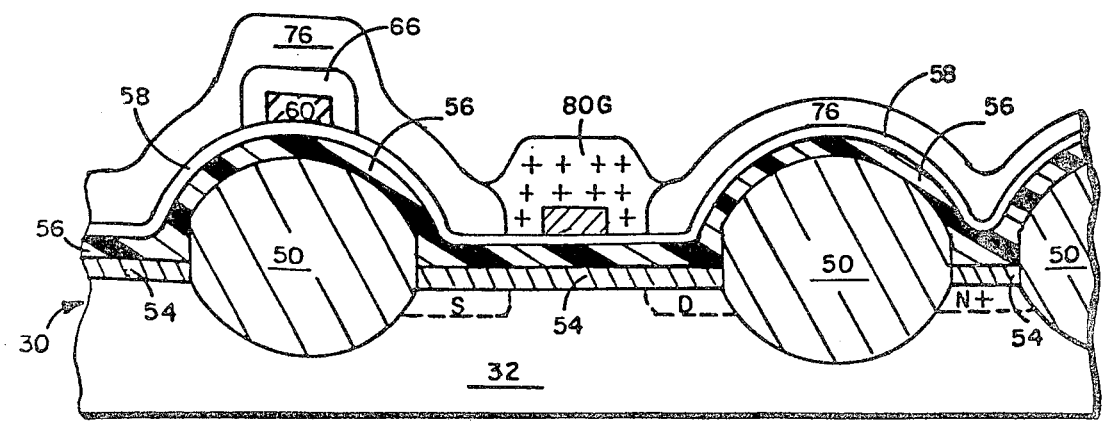

In either case, after removal of photoresist 68, or photoresist 72, depending upon which alternative is selected, a Silox layer 76, as employed in conjunction with FIGS. 22 through 25, is applied and for purposes of the direct gate contact transistor in question, a mask substantially corresponding to that of FIG. 29 having an enlarged nonprotective mask portion 122G is employed to open a window through the insulating Silox layer 72, thereby exposing the silicon layer 60 and its oxide layer 66 of the gate through the window. A metalization layer with suitable masking is employed to define the direct gate contact conducting line. The final structure particularly is as illustrated in FIG. 31 wherein the metal conducting line 80G making direct contact to the gate region is seen, deposited onto the gate polysilicon conductor 60 (after removal of the oxide layer 66) through the opening in the Silox layer 76 provided therefor.

Numerous salient features of the process of the invention and the resulting VSLI structure obtained should now be apparent. In the masking and photoresist protection of FIGS. 6 through 8, the field oxide is selectively grown initially in those areas intended to isolate active devices and diffused N+ lines from one another.

Figure 11:
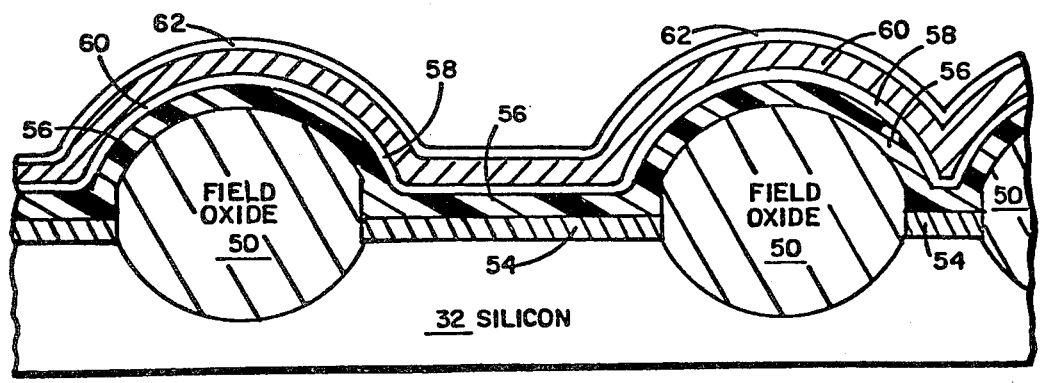
FIG. 11 is a further cross-sectional view as in FIG. 10 illustrating the application of additional silicon nitride, silicon oxynitride, polysilicon, and polysilicon oxide layers on the structure of FIG. 10.

Subsequent deposition steps are preferably performed on the smooth surface of a new thermally grown oxide. Thus, as seen in FIG. 11, a new silicon oxide layer 54 is thermally grown on the surface of the silicon wafer 32. That thermal oxidation will typically produce additional thickness of the field oxide 50. The nitride layer 56 which is applied over the newly grown oxide layer 54, including the field oxide 50, provides protection in subsequent etching steps, particularly in regard to opening a contact window to a polysilicon line such as 60, so as not to undercut the underlying field oxide 50 on which the polysilicon line 60 is formed and thus expose a side portion of the N+ conductive line 54 as might otherwise occur during etching performed in accordance with mask 120 of FIG. 15. By comparison of FIGS. 14, 15, and 16, it will be seen that the mask 122p which serves to open a window to the oxide 66 formed on the polysilicon line 60 is preferably of substantial extent to maximize alignment tolerances, and in fact may overlap onto the surface of the N+ line 54. The silicon nitride layer 56 permits the selective removal of the oxide without attacking the underlying field oxide and thus avoids the problem of the inadvertent opening of the sidewall of the N+ line to which an unwanted electrical connection might later occur in the metalization step for applying metal contacts to these contact areas.

Figure 13:
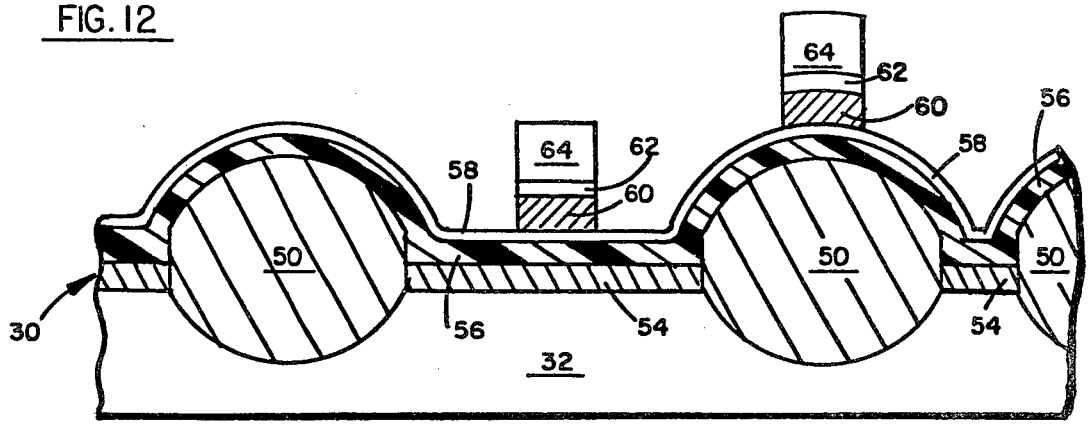
FIG. 13 is a cross-sectional view along the line 13—13 of FIG. 12 illustrating the structure resulting from photolithographic procedures using the mask of FIG. 12 on the structure of FIG. 11.

With reference to FIGS. 13 and 14, the use of the nitride layer 56 is also seen to be significant in that it permits the thermal oxidation of the gate polysilicon 60 and the polysilicon line 60 on the field oxide 50, without developing undesired thermal oxides in the areas over other contact regions ultimately to be defined, such as the source and drain regions of the active device associated with the gate and the N+ line contact area.

It is also significant that the nitride layer 56 may be removed from those contact areas by a batch etch and thus without the requirement of any further mask and attendant alignment problems, since a conventional wet etch can remove the nitride without attacking the oxide layer 66 formed on the gate polysilicon 60 and the polysilicon line 60.

In proceeding from FIG. 18 to FIG. 19, mask alignment tolerances again are non-critical since the gate polysilicon 60 remains protected by the very thick, thermally grown silicon dioxide layer 66. Thus, the exposed areas of the nitride layer 56 as defined by the mask 130 can be selectively removed, followed by a removal of the remaining portion of the silicon dioxide layer 54 thereby to expose the surface of the silicon 32 in the regions intended to define the source and drain of the active device. In this removal step, the oxynitride layer 58 must be etched by an oxide etch and as well the gate oxide layer 54 must be removed by an oxide etch; however, the thinness of these layers relative to the thickness of the oxide layer 66 on the gate polysilicon 60 permits the use of batch etch processes, without adversely affecting the integrity or electrical insulating characteristics required of the oxide 66 of the gate polysilicon 60.

Proceeding to FIG. 21, it is also clear that the silicon nitride layer 56 may be removed over the N+ line by a selective nitride etch, which correspondingly does not attack the field oxide 50. The window thus opened through the nitride layer 56 exposes the silicon dioxide layer 54 overlying the N+ line, which may be removed by an oxide etch. The thinness of the oxide layer 54, as before, permits its removal without deleteriously affecting the oxide layer 66 of the gate polysilicon 60, or the field oxide 50 due to the relatively greater thickness of the latter oxides.

In the final structure, minimal device geometry between source and drain is achieved since the displacement therebetween is defined only by the width of the gate structure, which has been minimized by the thermally grown oxide layer 66 on the gate polysilicon layer 66, which need be only sufficiently thick so as to afford the requisite electrical isolation of the gate polysilicon 60 from the adjoining contacts to the source and drain. In essence, electrical operating levels of the resultant device will determine the thickness necessary to assure adequate electrical insulation and isolation. In this regard, therefore, the device geometry and size may be minimized, as desired, limited only by the necessary thickness of the gate polysilicon oxide 66 necessary for this isolation purpose.

Figure 32:
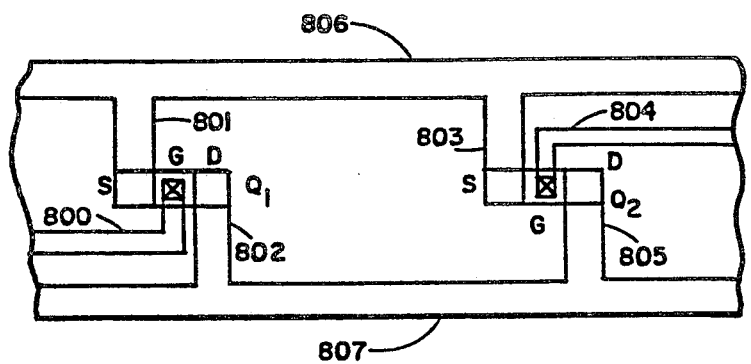
FIG. 32 illustrates an electrical integrated circuit which may be a portion of a VLSI circuit.
Figure 33:
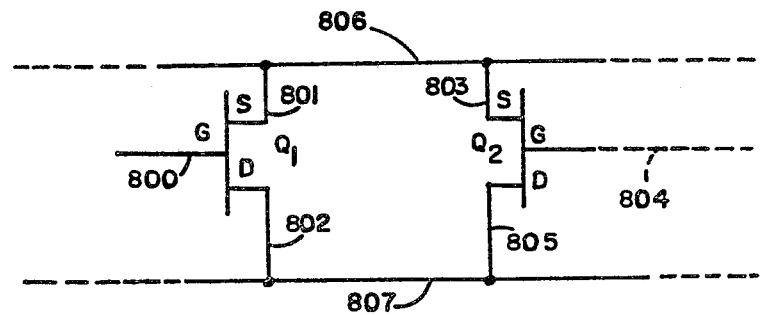
FIG. 33 is the equivalent electrical schematic of the structure of FIG. 32.

FIGS. 32 and 33 illustrate a practical circuit application of the process just described of employing diffused conducting lines for connecting to the source and drain regions of an FET, with the feature of a direct gate contact conducting line.

FIG. 32 is a partial plan view of a portion of a semiconductor substrate containing elements fabricated in accordance with the present invention. Illustrated are field effect transistor devices $Q_1$ and $Q_2$ each having a source, gate and drain. Connected to the respective sources of transistors $Q_1$ and $Q_2$ are diffused N+ lines 801 and 803 which have been interconnected by means of diffused N+ line 806. Similarly, the drains of transistors $Q_1$ and $Q_2$ are interconnected to each other by means of diffused N+ lines 802, 805, and 807. All of these diffused lines may be delineated simultaneously by means of the N-mask step. As illustrated in FIG. 32, diffused N+ lines 806 and 807 can extend in various directions on the substrate so as to interconnect with a plurality of additional devices. It is of course also possible to provide one or more contact regions to directly interconnect the N+ diffused lines 806 and 807 to the subsequent metalized interconnections delineated in the M-mask step.

The gates of transistors $Q_1$ and $Q_2$ are illustrated as being connected to polysilicon lines 800 and 804, respectively. These remote polysilicon lines could be connected to other portions of the circuitry contained on the substrate. In many cases, however, a direct contact rather than a remote contact would be provided so as to directly connect the gates of the transistors to the metalized interconnections delineated by the M-mask step.

FIG. 33 schematically illustrates the portion of the substrate circuitry illustrated in FIG. 32. Like designators of the elements in FIG. 33 correspond to like elements in FIG. 32.

An important usage for the circuitry shown in FIGS. 32 and 33 would be in the fabrication of monolithic random access memories or read only memories having a large number of memory elements. As indicated in the Summary of the Invention, the disclosed fabrication process lends itself to the fabrication of circuits having active devices and associated interconnects having substantially reduced surface area in comparison to circuitry fabricated by prior art methods. Since there are inherent size limitations in the surface area of the silicon substrates contained in integrated circuit chips, the advantageous reduction in the overall surface area of the elements fabricated in accordance with the present invention allows for the production of integrated circuit chips having greater numbers of memory elements. For example, the invention renders it feasible to produce random access memory chips in accordance with the present invention having 256 kilobits of memory storage capability whereas present day prior art fabrication techniques have only been able to produce commercially feasible random access memory chips having 32 kilobits of memory storage capability.

Figure 10:
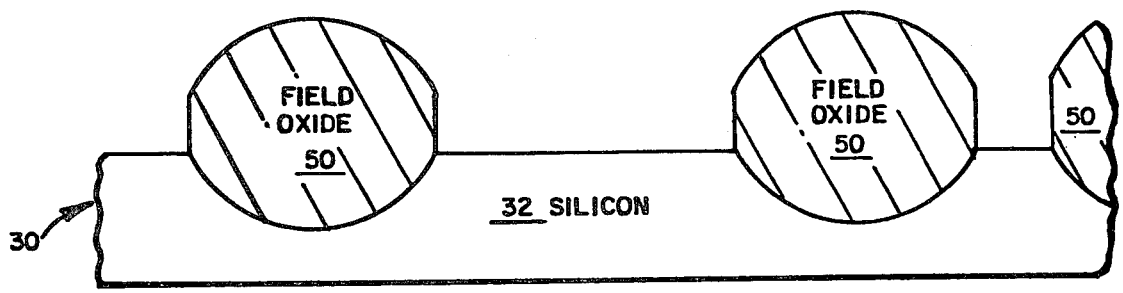
FIG. 10 is a cross-sectional view as in FIG. 9 after processing to remove intermediate silicon dioxide and silicon nitride strips extending between the field oxide on the silicon surface.

The masking effect of the nitride layer as utilized in the process steps discussed hereinbefore, such as for producing the silicon dioxide layers 66 on the polysilicon lines 60 (see, e.g., FIG. 14) may be further extended to facilitate opening contacts to a polysilicon line, or gate electrode, as well as to the source and drain of a transistor, and to a diffused line. This technique is shown in the following FIGS. 34 through 38 which moreover present an alternative approach mentioned earlier regarding the gate oxide layer. With reference to FIGS. 9 and 10, oxide layer 34 and nitride layer 36 were stripped from the surface of silicon 32 following development of the field oxide 50. As before explained, this is preferable in most cases since the gate oxide may then be regrown on the surface of silicon 32, as shown at 54 in FIG. 11, after which a new silicon nitride layer 56 is formed on the combined field oxide 50/gate oxide 54 surface.

Figure 34:
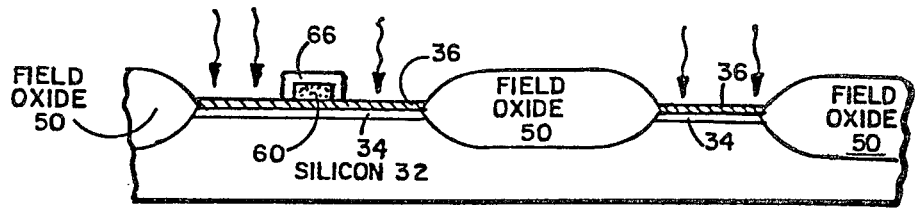
FIGS. 34, 35, 36, 37, and 38 illustrates successive steps in the production of source, drain, and remote polysilicon line connections and to the diffused line connection, as formed by a further alternative of the invention.

FIG. 34 illustrates an alternative in which the original gate oxide layer 34 and the original nitride layer 36 are retained, following the formation of the field oxide 50. Following steps corresponding to those of the mask of FIG. 12 and the resulting structures of FIGS. 13–15, a polysilicon layer is deposited on the nitride layer 36 and a polysilicon line 60 is delineated on the surface of field oxide 50. Ion doping of the resulting structure is performed as illustrated in FIG. 9.

Figure 35:
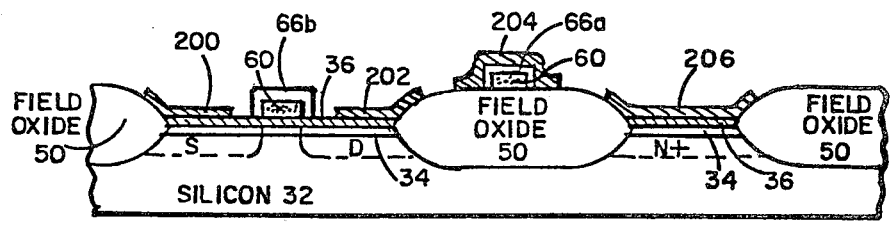
Figure 36:
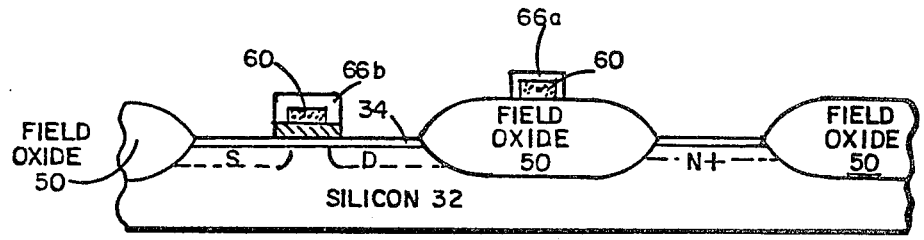
Figure 37:
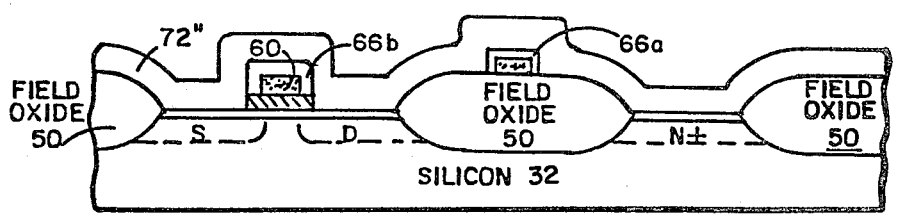

With reference to FIG. 35, a second silicon nitride layer is then formed on the surface defined in FIG. 34, followed by application of a photoresist layer (not shown) and a mask (not shown). To create the structure of FIG. 35, the mask includes protective areas over the source, drain, polysilicon line contact, and diffused line contact positions. After exposure of the photoresist, remaining areas of photoresist are removed to expose underlying portions of the silicon nitride layer which exposed portions then are removed by suitable etch or other nitride removal process. There results the structure shown in cross-section in FIG. 35 in which there remains silicon nitride pads, or buttons, overlying these intended contact areas. Particularly, the nitride button 200 remains on the nitride layer 34 overlying the source region, the nitride button 202 similarly overlies the drain region, nitride button 204 overlies the contact to the polysilicon line 60 on the field oxide 50, and then nitride button 206 overlies the contact position to the N+ line. As shown, these nitride buttons may be enlarged to overlap and extend along the surface of the field oxide 50 adjacent the intended contact areas.

Figure 38:
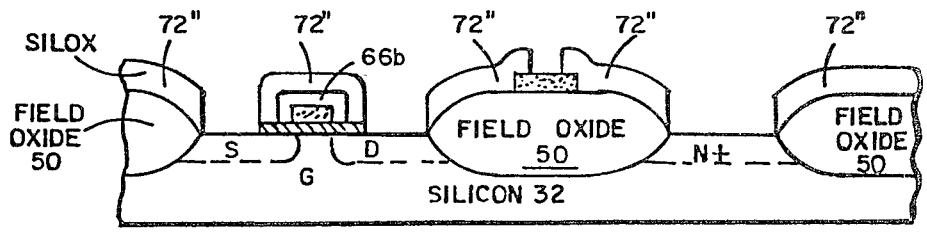

In this alternative process, an initial oxide layer 66A is formed on the polysilicon 60, both in the gate and on the field oxide, by thermal oxidation. After the silicon nitride pads are formed as shown in FIG. 35, the structure is subjected to further thermal oxidation or produce the desired thickness of silicon dioxide layer 66B on the gate polysilicon 60 and on the polysilicon line 60 on the field oxide 50. The nitride buttons, however, prevent the development of any significant amount of oxide on the respective underlying areas of the structure. The nitride buttons thereafter are removed by a selective material etch which removes nitride without attacking oxides and the resulting structure is shown in cross-section in FIG. 36. At this juncture, the thin gate oxide layer 34 remains over the surface of the source and drain, whereas the relatively thick (approximately 5000 Å) layer of silicon dioxide 60B remains on the gate polysilicon line 60 whereas only a relatively thin layer of oxide 66A remains on the polysilicon line 60 on the field oxide 50 in the contact area to that polysilicon line. The relatively thin gate oxide remains covering the source and drain areas and the N+ diffused line contact area. The relatively thin silicon dioxide layers 34 and 66A can be removed merely by time-controlled oxide etching, without deleteriously affecting the oxide layer 66B. Preferably, however, a doped layer of silicon dioxide (Silox) is formed on the entire surface of the structure of FIG. 36 and, by suitable masking, windows are opened through the Silox layer to expose the oxide-covered contact surfaces of the source and drain regions, the polysilicon line 60 on the field oxide 50, and the surface of the substrate 32 at the diffused line contact. The resulting configuration of the structure including the Silox layer 72" is shown in FIG. 38 wherein the contacts are now exposed through windows opened through to the Silox layer 72". Suitable conductive lines may be now be applied to these exposed contact areas in the manner as hereinbefore described with the resulting structure appearing substantially as in FIGS. 36 through 38.

Figure 30:
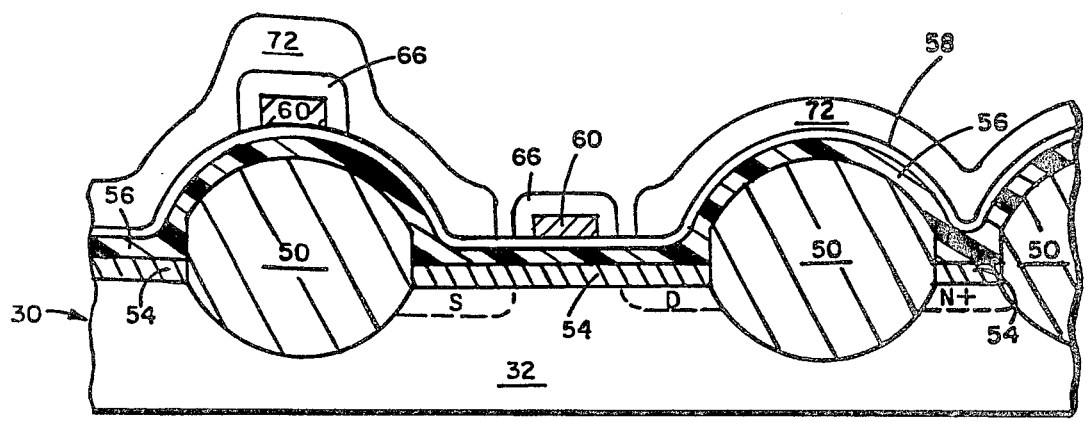
FIGS. 30 and 31 illustrate the formation of a direct gate contact.

As before noted, and pointed out with respect to FIGS. 29 through 31, a similar nitride pad or button can be formed alternatively on the gate oxide to achieve the direct gate contact structure of FIG. 31.

In summary, the present invention affords processes and resulting structures for achieving minimum size transistor devices and efficient and dense arrangements of polysilicon conducting lines and diffused lines in the substrate. These are the basic ingredients of achieving high density, or very large scale integrated (VLSI) circuits, brief examples of which have been shown hereinabove. Significant to the high density capability and miniaturization of device size are the features of self-aligned gates and contacts accomplished by the process of the invention. Tolerances on mask alignment are substantially improved and increased such that even where masking steps are employed in the various embodiments of the processes disclosed, mask alignment is noncritical. In general, windows to be opened through appropriate layers can be over-sized to increase the mask alignment tolerance, without introducing the possibility of short circuiting to any active or conductive region or structure.

Numerous modifications and variations of the process and device structures and configurations and of integrated circuit designs incorporating such devices will be apparent to those of skill in the art. For example, whereas N channel devices have been disclosed, it will be apparent that P channel devices instead can be made by this process. The processes have been illustrated as employing bulk silicon, but silicon layers on other substrates, such as silicon-on-sapphire, may be employed in the alternative.

These and other modifications and adaptations of the process and resulting structures and integrated circuits in accordance with this invention as disclosed herein will be apparent to those of skill in the art, and thus it is intended by the appended claims to cover all such modifications and adaptations which fall within the true spirit and scope of the invention.

I claim:

1. A process for fabricating a field effect semiconductor device on a mononcyrstalline silicon substrate having a first surface on which said device is to be formed, comprising the steps of:
   thermally oxidizing the surface of said semiconductor substrate to form a first silicon dioxide layer thereon,
   forming a first silicon nitride layer on said first silicon dioxide layer,
   retaining portions of said first silicon nitride layer and the corresponding underlying first silicon dioxide layer overlying a selected area of said substrate surface and removing remaining portions of said first silicon nitride and silicon dioxide layers to expose said substrate surface outside said selected area, thermally growing a field oxide on said exposed surface of said substrate surrounding said selected area, removing said first silicon nitride and silicon dioxide layers, thermally growing a second silicon dioxide layer on said selected area, forming a second silicon nitride layer on said second silicon dioxide layer on said field oxide, forming a thin silicon oxynitride layer on said second silicon nitride layer, depositing a layer of doped polysilicon on said silicon oxynitride layer, delineating said polysilicon layer to define a gate polysilicon layer extending transversly of said selected area for said device and to define at least one polysilicon conducting line on said second nitride layer over said field oxide and removing remaining portions of the polysilicon layer, said gate polysilicon layer defining first and second, remaining portions of said selected area corresponding to source and drain regions of said device and comprising the electrode of the gate of said device, oxidizing the surfaces of said gate polysilicon layer and of said at least one polysilicon conducting line while retaining said second silicon nitride layer over said source and drain regions of device to prevent the formation of any substantial amount of thermal oxide on said source and drain regions, removing exposed portions of said second silicon nitride layer by a material selective removal process including said silicon oxynitride layer formed thereon, thereby to expose the underlying said second silicon dioxide layer on said source and drain regions, removing the portions of said second silicon dioxide layer uncovered by removal of said portions of said second nitride layer, thereby to expose the surface of said substrate at said source and drain regions of said device and provide self-aligned vias for contacts to said source and drain regions of said device.

2. A process as recited in claim 1, further comprising, after oxidizing the surface of said gate polysilicon layer, implanting ions into said substrate for doping of said selecting areas, said silicon dioxide insulating layer formed on said gate polysilicon layer preventing doping of said substrate in the respectively underlying portion thereof.

3. A process as recited in claim 1 further comprising: subsequently to oxidizing the surfaces of said gate polysilicon layer and of said at least one polysilicon conducting line, selectively removing at least a portion of the oxide layer formed on the gate polysilicon layer to expose the surface of same and thereby afford a via for a contact directly to the gate of the device.

4. A process as recited in claim 3, further comprising: subsequently to the step of removing the portions of said second silicon dioxide layer, providing conductive lines extending over said field oxide and into contact with the exposed surfaces of said source and drain regions of said selected active device and to said exposed surface of said gate polysilicon layer to provide electrical connection thereto.

5. A process for fabricating very large scale integrated circuits including field effect semiconductor devices and diffused conducting lines on a monocrystalline silicon semiconductor substrate having a first surface on which said integrated circuits are to be formed, comprising the steps of:

forming a field oxide on said first surface surrounding and isolating selected areas of said first surface on which respectively corresponding said devices and diffused conducting lines are to be formed, each said device including source and drain regions in the corresponding said selected area and, for at least a selected such device, diffused conducting lines extending in common from respective said source and drain regions thereof to a position in said substrate remote from the gate of said selected device, thermally growing a silicon dioxide layer on said selected areas of said first surface, of a thickness suitable for the gate insulator layer of said device, forming a silicon nitride layer on said silicon dioxide layer extending at least over said selected areas, oxidizing said silicon nitride layer to form a silicon oxynitride layer thereon, depositing a layer of doped polysilicon on said silicon oxynitride layer, delineating said polysilicon layer to define a gate polysilicon layer extending transversely of said selected area for each said device and to define at least one polysilicon conducting line on said field oxide, and removing remaining portions of the polysilicon layer, said gate polysilicon layer defining first and second, remaining portions of said selected area corresponding to said source and drain regions to be formed for each said device and comprising the electrode of the gate of said device, oxidizing the surfaces of said gate polysilicon layer and of said at least one polysilicon conducting line while retaining the silicon nitride layer over said selected areas including said source and drain regions of each said device and said diffused conductive lines to prevent the formation of any substantial amount of thermal oxide on said source and drain regions, doping said source and drain regions and said diffused conducting lines, selectively removing a portion of the oxidized surface of said gate polysilicon layer for exposing same and affording a via for a direct contact to the gate of said device, removing the silicon oxynitride layers formed on the silicon nitride layers at least in the areas overlying said source and drain regions, and selectively removing portions of the silicon nitride layer overlying the said diffused conducting lines associated with said source and drain regions of each said selected device to expose the surfaces thereof at said remote positions thereof to provide vias for contacts thereto, removing any oxide material exposed by removal of the silicon nitride layer, and providing conductive lines extending over said field oxide and into contact with said remote, exposed portions of the surfaces of said diffused conducting lines associated with said source and drain regions of each said selected device and into contact with the exposed surface of said gate polysilicon layer to provide electrical connection thereto.

6. A process for fabricating very large scale intergrated circuits including field effect semiconductor devices and conducting lines on a monocrystalline silicon semiconductor substrate having a first surface on which said integrated circuitsaare to be formed, comprising the steps of:
- forming a field oxide on said first surface surrounding and isolating selected areas of said first surface on which respectively corresponding said devices are to be formed, each said device including source and drain regions in the corresponding said selected area and a gate on said substrate intermediate said source and drain regions
- thermally growing a silicon dioxide layer on said selected areas of said first surface, of a thickness suitable for the gate insulator layer of the gates of said devices,
- forming a silicon nitride layer on said silicon dioxide layer extending at least over said selected areas,
- oxidizing said silicon nitride layer to form a silicon oxynitride layer thereon,
- depositing a layer of doped polysilicon on said silicon oxynitride layer,
- delineating said polysilicon layer to define a gate polysilicon layer extending transversely of said selected area and comprising the electrode of the gate for each said device and to define at least one polysilicon conducting line on said field oxide, and removing remaining portions of the polysilicon layer, said gate polysilicon layer defining first and second, remaining portions of said selected area corresponding to said source and drain regions to be formed for each said device,
- oxidizing the surfaces of said gate polysilicon layer and of each said polysilicon conducting line while retaining the silicon nitride layer over said source and drain regions of each said device to prevent the formation of any substantial amount of thermal oxide on said source and drain regions, and
- selectively removing a portion of the oxidized surface of said gate polysilicon layer of at least a selected said device for exposing same and affording a via for a direct contact to the gate of said selected device.

7. A process as recited in claim 6, further comprising:
providing a conductive line extending over said field oxide and into contact with said exposed surface of said gate polysilicon layer to provide electrical connection to the gate of each said selected device.

8. A process as recited in claim 5 or 6, further comprising:
- subsequently to selectively removing a portion of the oxidized surface of said gate polysilicon layer for exposing same and affording a via for contact thereto, for each said selected device,
- selectively removing portions of the silicon nitride layer including at least the corresponding portions of said silicon oxynitride layer thereon overlying the source and drain regions in the corresponding said selected area for at least certain of said devices thereby to expose the underlying said silicon dioxide layer on said source and drain region,
- removing the portions of said silicon dioxide layer uncovered by removal of said portions of said silicon nitride layer, thereby to expose the surfaces of said source and drain regions to afford self-aligned vias for contacts thereto.

9. A process as recited in claim 5 or 7, further comprising:
- subsequently to the step of selectively removing a portion of the oxidized surface of said gate polysilicon layer for exposing same and affording a via for contact thereto, for each said selected device,
- removing the portions of said silicon nitride layer by a material selective removal process, thereby to expose the underlying said silicon dioxide layer on said source and drain regions,
- removing the portions of said silicon dioxide layer uncovered by removal of said portions of said second silicon nitride layer, thereby to expose the surface of said substrate at said source and drain regions and afford self-aligned vias for contacts to said source and drain regions of said device,
- providing conductive lines extending over said field oxide and into contact with said exposed surfaces of said gate polysilicon layer and of said source and drain regions to provide electrical connection thereto.

10. A process for fabricating a field effect semiconductor device on a monocrystalline silicon substrate having a first surface on which said device is to be formed, comprising the steps of:
- forming a field oxide on said first surface surrounding and isolating a selected area of said first surface on which said device is to be formed, said device including source and drain regions in said selected area and a gate intermediate said source and drain regions,
- thermally growing a silicon dioxide layer on said selected area of said first surface, of a thickness suitable for the gate insulator layer of said device,
- forming a silicon nitride layer on said silicon dioxide layer extending at least over said selected areas,
- forming a layer of silicon oxynitride on said silicon nitride layer,
- depositing a layer of doped polysilicon on said silicon oxynitride layer,
- delineating said polysilicon layer to define a gate polysilicon layer extending transversely of said selected area for said device and removing remaining portions of the polysilicon layer, said gate polysilicon layer defining first and second, remaining portions of said selected area corresponding to said source and drain regions to be formed for each said device and comprising the electrode of the gate of said device,
- oxidizing the surfaces of said gate polysilicon layer while retaining the silicon nitride layer over said source and drain regions of said device to prevent the formation of any substantial amount of thermal oxide on said source and drain regions, and
- selectively removing a portion of the oxidized surface of said gate polysilicon layer for exposing same and affording a via for a direct contact to the gate of said device.

11. A process as recited in claim 10, further comprising:
- removing the silicon oxynitride formed on the silicon nitride layers at least in the areas overlying said source and drain regions, and
- selectively removing portions of the silicon nitride layer overlying said source and drain regions of said device to expose the surfaces thereof and removing any oxide material layer portions exposed by removal of the silicon nitride layer, thereby providing vias for contacts thereto, and providing conductive lines extending over said field oxide and through said vias into contact with said exposed portions of the surfaces of said source and drain regions and into contact with the exposed surface of said gate polysilicon layer to provice electrical connection thereto.

12. A process as recited in claim 10, further comprising:

forming said field oxide on said first surface to surround and isolate further selected areas of said first surface on which respectively corresponding diffused conducting lines are to be formed, extending from respective said source and drain regions to a position remote from the gate of said device, simultaneously with said selected area, thermally growing said silicon dioxide layer on said further selected areas of said first surface, of a thickness suitable for the gate insulator of said device and forming said silicon nitride layer on said silicon dioxide layer extending at least over said selected and said further selected areas, removing any oxide material layer portions exposed by removal of the silcon nitride layer selectively removing portions of the silicon nitride layer overlying the said diffused conducting lines associated with said source and drain regions of said device to expose the surfaces thereof at said remote positions thereof to provide vias for contacts thereto, and providing conductive lines extending over said field oxide and through said vias into contact with said remote, exposed portions of the surfaces of said diffused conducting lines associated with said source and drain regions of said device and into contact with the exposed surface of said gate polysilicon layer to provide electrical connection thereto.

* * * * *

UNITED STATES PATENT AND TRADEMARK OFFICE
CERTIFICATE OF CORRECTION

PATENT NO. : 4,455,737
DATED : June 26, 1984
INVENTOR(S) : Gordon C. Godejahn, Jr.

It is certified that error appears in the above-identified patent and that said Letters Patent are hereby corrected as shown below:

Column 2, line 15, please change "cnverts" to read ---converts---.

Column 2, line 34, please change "reoved" to read ---removed---.

Column 9, line 46, please change "line" to read ---lines---.

Column 12, line 39, please change "60" to read ---66---.

Column 17, line 51, please change "selecting" to read ---selected---.

Signed and Sealed this

Third Day of September 1985

[SEAL]

Attest:

DONALD J. QUIGG

Attesting Officer    Acting Commissioner of Patents and Trademarks - Designate